(12) United States Patent
Yamazumi et al.

(10) Patent No.: US 10,256,377 B2
(45) Date of Patent: Apr. 9, 2019

(54) LIGHT-EMITTING DEVICE AND IMAGE DISPLAY APPARATUS

(71) Applicant: Sharp Kabushiki Kaisha, Sakai, Osaka (JP)

(72) Inventors: Noriyuki Yamazumi, Sakai (JP); Tatsuya Ryohwa, Sakai (JP); Kenichi Yoshimura, Sakai (JP); Hiroshi Fukunaga, Sakai (JP); Kanako Nakata, Sakai (JP); Makoto Izumi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/841,366

(22) Filed: Dec. 14, 2017

(65) Prior Publication Data
US 2018/0240946 A1    Aug. 23, 2018

(30) Foreign Application Priority Data

Feb. 21, 2017    (JP) ................... 2017-030231

(51) Int. Cl.
| H01L 33/50 | (2010.01) |
|---|---|
| H01L 33/54 | (2010.01) |
| H01L 33/62 | (2010.01) |
| H01L 33/56 | (2010.01) |
| H01L 33/48 | (2010.01) |
| F21V 8/00 | (2006.01) |

(Continued)

(52) U.S. Cl.
CPC .......... *H01L 33/505* (2013.01); *G02B 6/0073* (2013.01); *H01L 33/44* (2013.01); *H01L 33/486* (2013.01); *H01L 33/501* (2013.01); *H01L 33/502* (2013.01); *H01L 33/54* (2013.01); *H01L 33/56* (2013.01); *H01L 33/62* (2013.01); *G02B 6/0091* (2013.01); *G02F 1/1337* (2013.01); *G02F 1/1368* (2013.01); *G02F 1/133514* (2013.01); *G02F 1/133528* (2013.01); *G02F 1/134309* (2013.01); *G02F 2001/133614* (2013.01); *H01L 33/507* (2013.01)

(58) Field of Classification Search
CPC combination set(s) only.
See application file for complete search history.

(56) References Cited

U.S. PATENT DOCUMENTS

| 2010/0291374 A1* | 11/2010 | Akarsu | ................ | B82Y 20/00 |
|---|---|---|---|---|
| | | | | 428/328 |
| 2014/0158982 A1* | 6/2014 | Park, II | ................ | G02B 6/005 |
| | | | | 257/13 |

(Continued)

FOREIGN PATENT DOCUMENTS

| JP | 2003-249691 A | 9/2003 |
|---|---|---|
| JP | 2007-262375 A | 10/2007 |

(Continued)

*Primary Examiner* — Ratisha Mehta
(74) *Attorney, Agent, or Firm* — Keating & Bennett, LLP

(57) ABSTRACT

A light-emitting device includes a light-emitting element configured to emit excitation light, and a phosphor layer in which phosphor particles are dispersed so as to emit fluorescence in response to the excitation light. The phosphor layer includes a constitutional unit derived from an ionic liquid having a polymerizable functional group. The light-emitting device further includes a protective layer that seals the light-emitting element therein.

18 Claims, 5 Drawing Sheets

(51) Int. Cl.
    *H01L 33/44*     (2010.01)
    *G02F 1/1335*     (2006.01)
    *G02F 1/1337*     (2006.01)
    *G02F 1/1343*     (2006.01)
    *G02F 1/1368*     (2006.01)

(56) References Cited

U.S. PATENT DOCUMENTS

| | | |
|---|---|---|
| 2015/0023026 A1 | 1/2015 | Sakamoto et al. |
| 2016/0072026 A1 | 3/2016 | Kanaumi |
| 2017/0030532 A1 | 2/2017 | Ryohwa et al. |
| 2017/0166807 A1 | 6/2017 | Kuzumoto et al. |

FOREIGN PATENT DOCUMENTS

| | | |
|---|---|---|
| JP | 2010-004035 A | 1/2010 |
| JP | 2014-056896 A | 3/2014 |
| JP | 2015-023081 A | 2/2015 |
| JP | 2015-195269 A | 11/2015 |
| JP | 2017-032767 A | 2/2017 |
| JP | 2017-110059 A | 6/2017 |

\* cited by examiner

| | Presence of protective layer 11 | Lighting period | Discoloration of appearance | Light intensity attenuation ratio |
|---|---|---|---|---|
| Light-emitting device 1X (comparative example) | Absent | 5 hours | Discolored (to black) | 90% |
| Light-emitting device 1 | Present (silicone resin) | 5 hours | None | 1% |

LIGHT-EMITTING DEVICE AND IMAGE DISPLAY APPARATUS

BACKGROUND

1. Field

The following disclosure relates to a light-emitting device and an image display apparatus.

2. Description of the Related Art

In recent years, a light-emitting device has been developed that employs a combination of (i) an excitation light source such as a light emitting diode (LED), and (ii) a wavelength conversion member that converts excitation light from the excitation light source into fluorescence (for example, a member in which phosphor particles are dispersed in resin, namely, a phosphor layer).

For example, Japanese Unexamined Patent Application Publication No. 2014-56896 (published Mar. 27, 2014) discloses a light-emitting device having enhanced durability, which is an objective. This light-emitting device includes a protective layer that seals a blue LED (excitation light source), and a two-layered phosphor layer (a first phosphor layer and a second phosphor layer). In each of these two phosphor layers, a nanoparticle phosphor is dispersed.

SUMMARY

In recent years, as the nanoparticle phosphor in such a light-emitting device, a semiconductor nanoparticle phosphor may be employed. In this case, as a phosphor layer (resin layer) in which the semiconductor nanoparticle phosphor is dispersed, a "resin layer including a constitutional unit derived from an ionic liquid having a polymerizable functional group" (hereafter, also referred to as an "ionic liquid resin layer") may be suitably employed. This is because the ionic liquid resin layer is stable against heat and has high compatibility with semiconductor nanoparticle phosphors.

However, as described later, the inventors of the present application (hereafter, also simply referred to as the "inventors") have newly found that contact of the ionic liquid resin layer with an electrode included in the excitation light source and the package may cause degradation of the light-emitting device.

Such a phenomenon is not described in any publicly known documents. There are also no publicly known documents that disclose the specific configuration of a light-emitting device that addresses the phenomenon.

Accordingly, it is desirable to provide a light-emitting device having higher durability to address the phenomenon.

According to an aspect of the disclosure, there is provided a light-emitting device including an excitation light source configured to emit excitation light; a phosphor layer in which a semiconductor nanoparticle phosphor is dispersed so as to emit fluorescence in response to the excitation light, the phosphor layer including a constitutional unit derived from an ionic liquid having a polymerizable functional group; and a protective layer that seals the excitation light source therein.

DESCRIPTION OF THE EMBODIMENTS

First Embodiment

Figure 1:
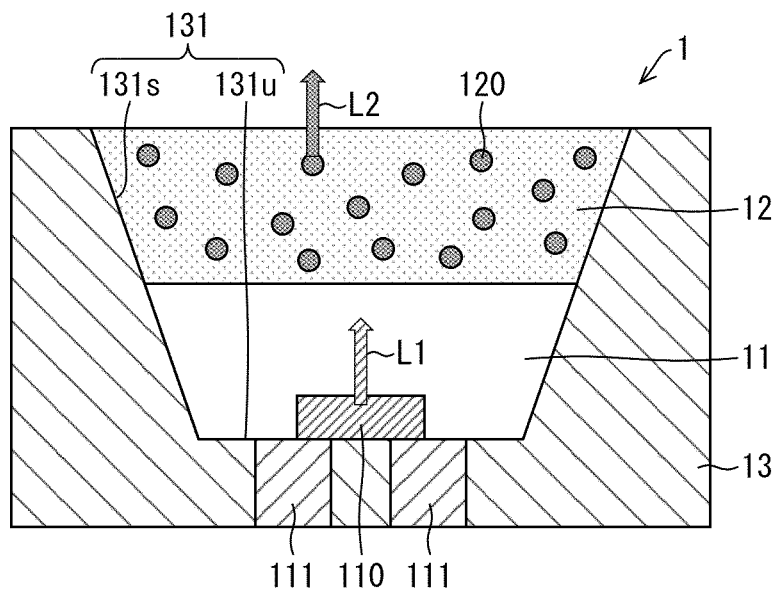
FIG. 1 is a schematic view of a light-emitting device according to First embodiment.

Hereinafter, First embodiment according to the present disclosure will be described in detail with reference to FIG. 1 to FIG. 3. Referring to FIG. 1, a light-emitting device 1 according to First embodiment will be first outlined. FIG. 1 is a schematic view of the light-emitting device 1.

The light-emitting device 1 includes a protective layer 11, a phosphor layer 12, a package 13, a light-emitting element 110 (excitation light source), electrodes 111, and phosphor particles 120 (semiconductor nanoparticle phosphor).

As illustrated in FIG. 1, the light-emitting element 110 is sealed within the protective layer 11. Within the phosphor layer 12, the phosphor particles 120 are dispersed. The phosphor layer 12 is also referred to as a wavelength conversion member. As described later, the phosphor layer 12 is a resin layer (ionic liquid resin layer) including a constitutional unit derived from an ionic liquid having a polymerizable functional group.

Hereafter, for ease of explanation, a direction from the protective layer 11 toward the phosphor layer 12 will be referred to as an upward direction. Another direction opposite to the upward direction, namely, a direction from the phosphor layer 12 toward the protective layer 11, will be referred to as a downward direction.

As illustrated in FIG. 1, in the light-emitting device 1, the protective layer 11 and the phosphor layer 12 are in direct contact with each other. Alternatively, in a light-emitting device according to another embodiment of the present disclosure, the protective layer 11 and the phosphor layer 12 may be in indirect contact with each other with a chemical bonding layer 21 or 31 therebetween (refer to FIG. 5A, FIG. 5B, FIG. 6A, and FIG. 6B described later).

Light-Emitting Element 110

The light-emitting device 1 includes the light-emitting element 110, which is an excitation light source configured to emit excitation light L1 in the upward direction. As described above, the light-emitting element 110 is sealed within the protective layer 11. The light-emitting element 110 is supported by the package 13 (more specifically, by a bottom surface 131u described later). In the light-emitting device 1, the excitation light L1 is emitted from the light-emitting element 110 to the phosphor particles 120, which are dispersed within the phosphor layer 12.

The phosphor particles 120 are excited by the excitation light L1 (in response to the excitation light L1) to emit fluorescence L2 having a longer wavelength than the excitation light L1. As a result, mixed light of the excitation light L1 and the fluorescence L2 is emitted as illumination light in the upward direction of the light-emitting device 1. Incidentally, the illumination light may also be referred to as output light L (refer to FIG. 7 described later).

Thus, by appropriately selecting the colors of the excitation light L1 and the fluorescence L2, illumination light of a desired color is obtained. For example, when the excitation light L1 is blue light and the fluorescence L2 is yellow light, illumination light of white (more precisely, pseudo-white) is obtained.

First embodiment describes an example in which the light-emitting element 110 is a blue LED configured to emit blue light as the excitation light L1. However, the excitation light L1 is not limited to blue light as long as it is light in a wavelength range that appropriately enables excitation of the phosphor particles 120. For example, the excitation light L1 may be visible light of a predetermined color other than blue (for example, green light).

Alternatively, the excitation light L1 may be invisible light. For example, the excitation light L1 may be UV (ultraviolet) light. When the excitation light L1 is invisible light, the color of the illumination light is substantially the same as the color of the fluorescence L2. The wavelength range of the excitation light L1 may be appropriately selected in accordance with the type of phosphor particles 120.

The light-emitting element 110 is not limited to an LED, and may be a laser diode, for example. The light-emitting element 110 may be freely selected as long as it is a light-emitting element configured to function as an excitation light source that emits the excitation light L1 in response to an electrical input.

Incidentally, the light-emitting device 1 is equipped with an electric circuit (not shown) configured to drive the light-emitting element 110. This electric circuit includes the electrodes 111 configured to apply electrical inputs to the light-emitting element 110 (configured to drive the light-emitting element 110).

FIG. 1 illustrates, as an example, the configuration in which two electrodes 111 are formed within the package 13. These two electrodes 111, their upper surfaces, are partially in contact with the light-emitting element 110. Of the two electrodes 111, one may be used as an anode electrode, and the other may be used as a cathode electrode.

One of the electrodes 111 (anode electrode) is connected to an anode electrode (not shown) within the light-emitting element 110. The other one of the electrodes 111 (cathode electrode) is connected to a cathode electrode (not shown) within the light-emitting element 110. As a result, electrical inputs are applied, via the electrodes 111, to the light-emitting element 110. The electrodes 111 are at least formed so as to be included in the light-emitting element 110 and the package 13.

Phosphor Particles 120

The phosphor particles 120 may be freely selected from semiconductor nanoparticle phosphors. For example, the phosphor particles 120 may be a publicly known semiconductor nanoparticle phosphor having a diameter of 0.1 nm or more and 100 nm or less. Semiconductor nanoparticle phosphor quanta are also referred to as quantum dot phosphor particles. Specific examples of the material for the phosphor particles 120 will be described later in Fifth embodiment.

As described above, the phosphor particles 120 receive the excitation light L1 to emit the fluorescence L2. Semiconductor nanoparticle phosphors are phosphor particles having high light-emitting efficiency, and hence are suitable for enhancing the light-emitting efficiency of the light-emitting device 1.

By changing the particle size or material composition of the phosphor particles 120, the energy band gap of the phosphor particles 120 can be controlled. In other words, by changing the particle size or material composition of the phosphor particles 120, the wavelength of the fluorescence L2 emitted from the phosphor particles 120 (more specifically, the wavelength spectrum) can be controlled.

The phosphor particles 120 may each be constituted by (i) a semiconductor nanoparticle core, (ii) a shell layer covering the surface of the semiconductor nanoparticle core, and (iii) a modification organic compound layer bonding to the surface of the shell layer.

The modification organic compound layer may contain publicly known ionic surface-modifying molecules. Such ionic surface-modifying molecules are polar molecules, and, for example, their negative poles bond to the surface of the shell layer. The modification organic compound layer is thus formed in each phosphor particle 120, so that, within the phosphor layer 12 (ionic liquid resin layer) described later, the phosphor particles 120 in a more electrostatically stabilized state are strongly protected. As a result, degradation of the phosphor particles 120 is further suppressed.

Protective Layer 11

The protective layer 11 is disposed to seal the light-emitting element 110. The protective layer 11 is disposed to prevent the light-emitting element 110 from coming into contact with members other than the protective layer 11 and the electrodes 111, which are exposed at the bottom surface 131*u* of the package 13. In particular, the protective layer 11 prevents the light-emitting element 110 and the electrodes 111 from coming into contact with the phosphor layer 12 (the layer in contact with the upper surface of the protective layer 11).

From the viewpoint of enhancing the light-emitting efficiency of the light-emitting device 1, the material for the protective layer 11 may be a material having high light transmittance; in other words, the protective layer 11 may be formed so as to have high light transmittance.

From the viewpoint of enhancing the durability of the light-emitting device 1, the protective layer 11 may be formed so as to have high heat resistance, high light resistance, and high discoloration resistance.

As described later, the phosphor layer 12 contains sulfur (S) as a constituent element. Regarding this point, the inventors have newly found the following problem: when the phosphor layer 12 is in contact with the electrodes 111, which are included in the light-emitting element 110 and the package 13, portions of the electrodes 111 in contact with the phosphor layer 12 may be sulfurized.

When the electrodes 111 are sulfurized, the electrodes may be corroded. As a result, with the corrosion of the electrodes, the electric characteristics of the electrodes (such as electric conductivity) may be degraded. In such a case, the light-emitting efficiency of the light-emitting element 110 decreases, which results in a decrease in the light-emitting efficiency of the light-emitting device 1.

When the electrodes 111 are seriously corroded, a considerable decrease is caused in the intensity (or amount of light) of the excitation light L1 emitted from the light-emitting element 110. As a result, the corresponding decrease is caused in the intensity (or amount of light) of the fluorescence L2 emitted from the phosphor particles 120.

In such a case where the electrodes 111 are sulfurized, the light-emitting device 1 may no longer function as designed. In other words, the light-emitting device 1 may no longer emit illumination light at a predetermined intensity (or in a predetermined amount of light) as designed.

As has been described, the inventors have newly found the following problem: when the phosphor layer 12 is in contact with the light-emitting element 110, the resultant sulfurization of the electrodes 111 may cause degradation of the light-emitting device 1.

In order to address this problem, the inventors have newly found the following technical idea: the protective layer 11 is formed to isolate the light-emitting element 110 from the phosphor layer 12. As described later, this configuration enables a light-emitting device 1 having higher durability.

The specific examples of the material for the protective layer 11 will be described later in Fourth embodiment. First embodiment describes an example case in which the material for the protective layer 11 is a silicone resin.

Phosphor Layer 12

The phosphor layer 12 seals the phosphor particles 120 therein. More specifically, the phosphor particles 120 are dispersed within the phosphor layer 12. The phosphor layer 12 includes a constitutional unit derived from an ionic liquid having a polymerizable functional group. The phosphor layer 12 is also referred to as an ionic liquid resin layer.

The phosphor layer 12 is stable against heat, and has high compatibility with the phosphor particles 120. Thus, the interfaces between the phosphor layer 12 and the phosphor particles 120 are chemically stable. In particular, when the phosphor particles 120 are semiconductor nanoparticles, the stability and compatibility are high.

The phosphor layer 12 is thus disposed, so that the surfaces of the phosphor particles 120 are sufficiently protected from the air and moisture, for example. In addition, the phosphor particles are electrostatically stabilized. Furthermore, thermal degradation of the phosphor particles 120 is particularly suppressed. As a result, the light-emitting efficiency of the light-emitting device 1 is enhanced.

From the viewpoint of further enhancing the light-emitting efficiency of the light-emitting device 1, the phosphor layer 12 may also have high light transmittance as with the protective layer 11.

As described above, the phosphor layer 12 contains sulfur as a constituent element. More specifically, the ionic liquid used to form the phosphor layer 12 contains sulfur as a constituent element.

For example, the ionic liquid used to form the phosphor layer 12 is a salt in a molten state at ordinary temperature (for example, at 25° C.) (molten salt at ordinary temperature), and may be represented by the following general formula (I).

$$X^+Y^- \quad (I)$$

In the general formula (I), $X^+$ may represent any one of the following:
an imidazolium ion,
a pyridinium ion,
a phosphonium ion,
aliphatic quaternary ammonium ions,
a pyrrolidinium ion, and
a sulfonium ion.

Of these, because of high thermal stability and high stability in the air, aliphatic quaternary ammonium ions may be employed as cations (positive ions).

In the general formula (I) above, $Y^-$ may represent any one of the following:
a tetrafluoroborate ion,
a hexafluorophosphate ion,
a bistrifluoromethylsulfonylimidate ion,
a perchlorate ion,
a tris(trifluoromethylsulfonyl)carbonate ion,
a trifluoromethanesulfonate ion,
a trifluoroacetate ion,
a carboxylate ion, and
halogen ions.

Of these, because of high thermal stability and high stability in the air, the bistrifluoromethylsulfonylimidate ion may be employed as the anion (negative ion).

The phosphor layer 12 is formed by polymerizing an ionic liquid in which the phosphor particles 120 are dispersed. This enables suppression of agglomeration of the phosphor particles 120 within the phosphor layer 12.

The polymerizable functional group of the ionic liquid is not particularly limited. The polymerizable functional group may be a (meth)acrylate group ((meth)acryloyloxy group). This is because this polymerizable functional group enables solidification of the ionic liquid while the dispersion state of the phosphor particles 120 is maintained.

Examples of such an ionic liquid having a (meth)acrylate group include 2-(methacryloyloxy)-ethyltrimethylammonium bis(trifluoromethanesulfonyl)imide represented by the following formula

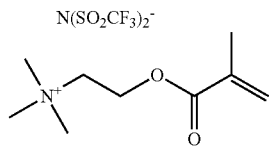

and 1-(3-acryloyloxy-propyl)-3-methylimidazolium bis(trifluoromethanesulfonyl)imide represented by the following formula

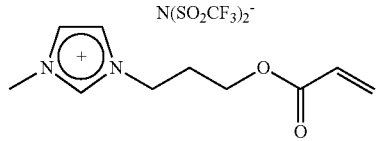

which have high thermal stability and high stability in the air.

Such an ionic liquid having a polymerizable functional group may be obtained by introducing, by an appropriately selected known method, the polymerizable functional group into an appropriately selected known ionic liquid. Alternatively, commercially available ionic liquids having polymerizable functional groups may be used.

The polymerization conditions such as temperature and time are not particularly limited for the polymerization of an ionic liquid having a polymerizable functional group in which the phosphor particles 120 are dispersed, as long as the conditions are appropriately selected in accordance with, for example, the type and amount of the ionic liquid.

When the ionic liquid is, for example, 2-(methacryloyloxy)-ethyltrimethylammonium bis(trifluoromethanesulfonyl)imide, it can be polymerized at a temperature of 60° C. to 100° C. for 1 to 10 hours. Alternatively, when the ionic liquid is 1-(3-acryloyloxy-propyl)-3-methylimidazolium bis (trifluoromethanesulfonyl)imide, it can be polymerized at a temperature of 60° C. to 150° C. for 1 to 10 hours.

When a catalyst is used for the polymerization of an ionic liquid, the catalyst is also not particularly limited and, for example, may be selected from the following known catalysts:

azobisisobutyronitrile, and
dimethyl 2,2'-azobis(2-methylpropionate).

In particular, azobisisobutyronitrile may be used as the catalyst because the polymerization proceeds rapidly.

When a cross-linking agent is added to the ionic liquid, the amount of cross-linking agent added is also not particularly limited. However, this amount relative to 100 parts by weight of the ionic liquid is preferably in a range of 1 to 50 parts by weight, more preferably in a range of 10 to 30 parts by weight.

When the amount of the cross-linking agent added relative to 100 parts by weight of the ionic liquid is less than 1 part by weight, formation of the cross-linked structure may not proceed and the phosphor layer 12 may have insufficient strength. On the other hand, when the amount of the cross-linking agent added relative to 100 parts by weight of the ionic liquid is more than 50 parts by weight, the phosphor particles 120 may not be stably dispersed within the phosphor layer 12.

Package 13

The package 13 has a receptacle portion 131, which receives the protective layer 11 and the phosphor layer 12. The package 13 functions as a support member such that a side surface 131s and the bottom surface 131u of the receptacle portion 131 support the protective layer 11 and the phosphor layer 12. The package 13 also supports, with the bottom surface 131u, the light-emitting element 110 sealed within the protective layer 11.

The material for the package 13 may be a chemically stable material for the purpose of suppressing sulfurization due to contact with the phosphor layer 12. Examples of the chemically stable material include white resins prepared by dispersing inorganic oxides in resin materials.

Examples of the resin materials include silicone resins, epoxy resins, unsaturated polyester resins, silicone-epoxy hybrid resins, polyamide resins, and polycyclohexylenedimethylene terephthalate (PCT) resins.

Examples of the inorganic oxides include titanium oxide, zinc oxide, aluminum oxide, magnesium oxide, zirconium oxide, antimony oxide, aluminum hydroxide, and magnesium hydroxide.

The package 13 also functions as a radiator member that dissipates, to the outside of the light-emitting device 1, (i) heat generated within the protective layer 11 (in particular, heat generated in the light-emitting element 110), and (ii) heat generated in the phosphor layer 12 (in particular, heat generated in the phosphor particles 120). From the viewpoint of enhancing the light-emitting efficiency of the light-emitting device 1, the material for the package 13 may be a resin material that is stable against heat, and has high thermal conductivity. Examples of such resin materials include epoxy resins and silicone resins.

In addition, the package 13 also functions as a reflective member configured to reflect light (the excitation light L1 and the fluorescence L2), and leakage of light from the package 13 may be minimized. From the viewpoint of enhancing the light extraction efficiency of the light-emitting device 1, the material for the package 13 may be an inorganic oxide having a high refractive index. This inorganic oxide may be titanium oxide.

Example of Method for Producing Light-Emitting Device 1

An example of the method for producing the light-emitting device 1 includes the following Steps A1 to A3.

Step A1

The light-emitting element 110 is placed on the bottom surface 131u of the package 13. Subsequently, the light-emitting element 110 is brought into contact with the electrodes 111 (the light-emitting element 110 is connected to the electrodes 111). Subsequently, a resin material (such as a silicone resin) for forming the protective layer 11 is applied to the entirety of the bottom surface 131u so as to cover the entirety of the light-emitting element 110. Subsequently, the resin material is heated, for example, at a temperature of 150° C. or less to cure the resin material.

Step A2

The upper surface (front surface) of the protective resin cured in Step A1 above is irradiated with ultraviolet light at a wavelength of 185 nm and ultraviolet light at a wavelength of 254 nm for about 15 minutes. Such ultraviolet light irradiation causes generation of ozone, and the ozone further promotes the chemical reaction in the upper surface of the protective resin. Thus, the above-described protective layer 11 is obtained.

Step A3

Immediately after completion of the ultraviolet light irradiation, the upper surface of the protective layer 11 is coated with an ionic liquid resin (resin including a constitutional unit derived from an ionic liquid) in which the phosphor particles 120 are dispersed. Subsequently, the ionic liquid resin is heated, for example, at a temperature of 120° C. or less to cure the resin material. As a result, the above-described phosphor layer 12 is obtained.

Evaluation of Durability of Light-Emitting Device 1

In addition to the light-emitting device 1, the inventors also produced, as a comparative example for the light-emitting device 1, a light-emitting device 1X described below. The inventors performed a test in order to compare, in terms of durability, the light-emitting device 1 and the light-emitting device 1X.

Figure 2:
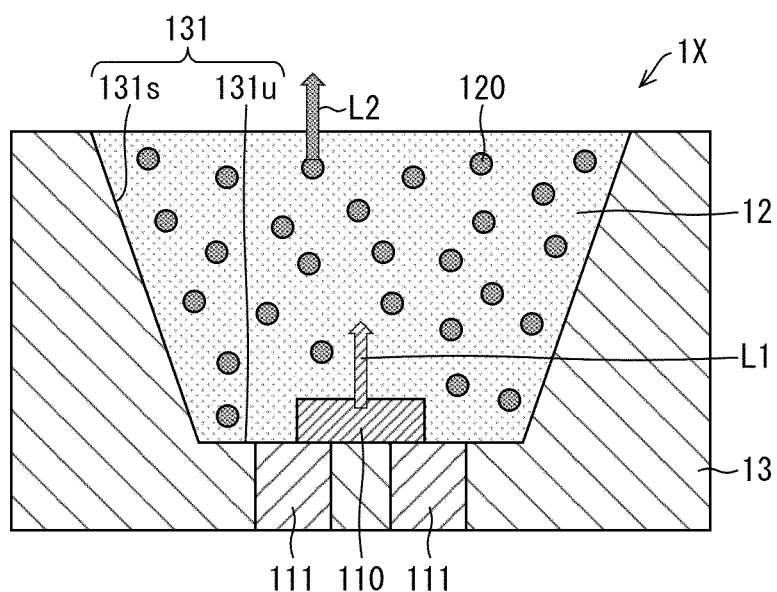
FIG. 2 is a schematic view of a light-emitting device serving as a comparative example for the light-emitting device in FIG. 1.

FIG. 2 is a schematic view of the light-emitting device 1X. As illustrated in FIG. 2, the light-emitting device 1X is the same as the light-emitting device 1 except that the protective layer 11 is absent. In the light-emitting device 1X, the phosphor layer 12 is formed in the receptacle portion 131 so as to occupy also a portion (space) of the protective layer 11 of the light-emitting device 1.

In other words, in the light-emitting device 1X, the light-emitting element 110 is sealed within the phosphor layer 12. This point of the light-emitting device 1X as the comparative example is significantly different from the light-emitting device 1 according to First embodiment.

Figures 3, 4:
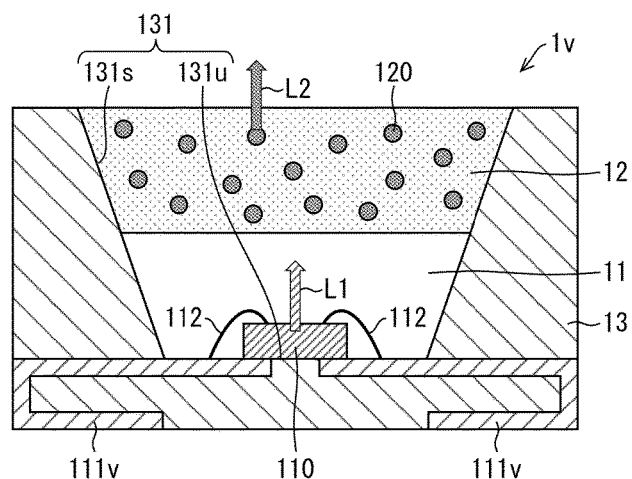
FIG. 3 describes the results of a test for examining the durability of the light-emitting device in FIG. 1 and the light-emitting device in FIG. 2.
FIG. 4 is a schematic view of a light-emitting device serving as a modification of the light-emitting device in FIG. 1.

FIG. 3 is a table that describes the results of the test (comparison of the results). The inventors applied a constant current to each of the light-emitting device 1 and the light-emitting device 1X to drive (light) the light-emitting devices. Subsequently, when a predetermined time has elapsed (at the finish time) from the start of application of the current (at the start time), the inventors examined the state of the light-emitting device 1 and the light-emitting device 1X.

In FIG. 3, an item "Presence of protective layer 11" describes whether or not the light-emitting device 1 and the light-emitting device 1X each have the protective layer 11. As described above, the light-emitting device 1X does not have the protective layer 11. On the other hand, the light-emitting device 1 has the protective layer 11 (material: silicone resin).

In FIG. 3, another item "Lighting period" describes the period from the start time to the finish time. This test was performed such that, in each of the light-emitting device 1 and the light-emitting device 1X, the lighting period was set to 5 hours.

In FIG. 3, another item "Discoloration of appearance" describes the observation results of a change (discoloration) in the appearance of the electrodes 111 of each of the light-emitting device 1 and the light-emitting device 1X at the finish time.

In the light-emitting device 1X, discoloration of the electrodes 111 from silver to black was observed. This has demonstrated that, in the light-emitting device 1X, the sulfur component of the phosphor layer 12 (ionic liquid resin layer) is in contact with the electrodes 111 to sulfurize the electrodes 111.

On the other hand, in the light-emitting device 1, no discoloration of the electrodes 111 was observed (the color of the electrodes 111 remained silver). This has demonstrated that, in the light-emitting device 1, the protective layer 11 isolates the light-emitting element 110 and the electrodes 111 from the phosphor layer 12, so that sulfurization of the electrodes 111 was prevented.

In each of the light-emitting device 1 and the light-emitting device 1X, (i) the intensity of the illumination light at the start time will be referred to as a start-time intensity, and (ii) the intensity of the illumination light at the finish time will be referred to as a finish-time intensity.

In FIG. 3, another item "Light intensity attenuation ratio" describes, in each of the light-emitting device 1 and the light-emitting device 1X, a ratio (percent) of "the difference between the start-time intensity and the finish-time intensity" to "the start-time intensity". The light intensity attenuation ratio is an index that represents the degree of attenuation (decrease) from the start-time intensity (initial value of the intensity of the illumination light) to the finish-time intensity.

In the light-emitting device 1X, a very high light intensity attenuation ratio of about 90% was observed. In other words, in the light-emitting device 1X, a considerable decrease occurred from the start-time intensity to the finish-time intensity. This has demonstrated that the electrodes 111 were sulfurized and, as a result, the light-emitting device 1X no longer functioned as designed (no longer provided the light-emitting performance as designed).

On the other hand, in the light-emitting device 1, a very low light intensity attenuation ratio of about 1% was observed. In other words, in the light-emitting device 1, substantially no decrease occurred from the start-time intensity to the finish-time intensity. This has demonstrated that the protective layer 11 prevented sulfurization of the electrodes 111, so that the light-emitting device 1 still sufficiently functioned as designed (still sufficiently provided the light-emitting performance as designed).

In summary, the inventors have demonstrated that the light-emitting device 1 is a light-emitting device having sufficiently higher durability than the light-emitting device 1X.

Advantages of Light-Emitting Device 1

In the light-emitting device 1, the protective layer 11 is disposed to isolate the light-emitting element 110 and the electrodes 111 from the phosphor layer 12 (ionic liquid resin layer containing a sulfur component). Specifically, the light-emitting element 110 is sealed within the protective layer 11, so that, in addition to the light-emitting element 110, the electrodes 111 can also be disposed so as to be isolated from the phosphor layer 12. As a result, sulfurization of the electrodes 111 is prevented.

Thus, the light-emitting device 1 enables sufficient enhancement of the durability of the light-emitting device, compared with the existing light-emitting device (light-emitting device not having the protective layer 11 that isolates the light-emitting element 110 from the phosphor layer 12). In other words, the light-emitting device 1 enables a light-emitting device having higher durability than the existing one.

In the light-emitting device 1, the protective layer 11 is disposed to thereby provide another advantage of suppressing decomposition of the phosphor particles 120 (semiconductor nanoparticle phosphor) contained in the phosphor layer 12. Hereinafter, the mechanism by which decomposition of the phosphor particles 120 is suppressed will be described.

In general, the phosphor particles 120 (semiconductor nanoparticle phosphor) may be decomposed by being irradiated with the excitation light L1 having a high energy density. However, in the light-emitting device 1, the protective layer 11 is disposed so as to sufficiently isolate the phosphor particles 120 from the light-emitting element 110 (excitation light source). In other words, in the light-emitting device 1, the phosphor particles 120 can be disposed farther from the light-emitting element 110 than in the light-emitting device 1X (light-emitting device not having the protective layer 11).

In this way, the phosphor particles 120 are disposed farther from the light-emitting element 110, to thereby achieve a decrease in the energy density of the excitation light L1 applied to the phosphor particles 120. This enables a reduction in the possibility of irradiation of the phosphor particles 120 with the excitation light L1 having a high energy density, to thereby suppress decomposition of the phosphor particles 120.

Modification

Incidentally, the electrode configuration of a light-emitting device according to an embodiment of the present disclosure is not limited to the above-described electrodes 111. Hereinafter, a light-emitting device 1v serving as a modification of the light-emitting device 1 according to First embodiment will be described with reference to FIG. 4. FIG. 4 is a schematic view of the light-emitting device 1v.

The light-emitting device 1v has the same configuration as the light-emitting device 1 except that the electrodes 111 are replaced by electrodes 111v, and wires 112 are added. The electrodes 111v are disposed so as to surround the periphery of the bottom portion of the package 13, which is different from the electrodes iii.

In the light-emitting device 1v, the electrodes 111v are connected, via two wires 112 sealed within the protective layer 11, to the anode electrode and the cathode electrode (not shown) of the light-emitting element 110. Incidentally, in the electrodes 111v, portions (exposed portions) exposed at the bottom surface 131u of the package 13 are used to fix the light-emitting element 110 and the wires 112.

In the light-emitting device 1v, the electrodes 111v and the wires 112 constitute electrodes (electrodes included in the light-emitting element 110 and the package 13) configured to apply electrical inputs to the light-emitting element 110.

Also in the light-emitting device 1v, the protective layer 11 is disposed to isolate the light-emitting element 110, the electrodes 111v, and the wires 112 from the phosphor layer 12. This prevents sulfurization of the electrodes 111v and the wires 112 (electrodes included in the light-emitting element 110 and the package 13).

Second Embodiment

Hereinafter, Second embodiment according to the present disclosure will be described with reference to FIG. 5A and FIG. 5B. Incidentally, for ease of explanation, members having the same functions as in the above-described embodiment will be denoted by the same reference signs and descriptions thereof will be omitted.

Figure 5A:
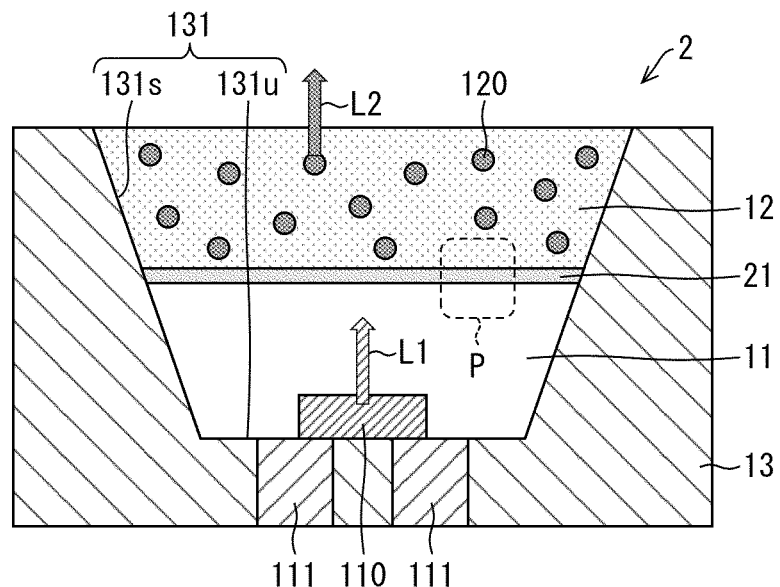
FIG. 5A is a schematic view of a light-emitting device according to Second embodiment.

FIG. 5A is a schematic view of a light-emitting device 2 according to Second embodiment. The light-emitting device 2 has the same configuration as in the light-emitting device 1 according to First embodiment except that a chemical bonding layer 21 is further disposed. As illustrated in FIG. 5A, the chemical bonding layer 21 is disposed between the protective layer 11 and the phosphor layer 12.

In other words, in the light-emitting device 2, the protective layer 11 and the phosphor layer 12 are in indirect contact with each other with the chemical bonding layer 21 therebetween. In the light-emitting device 2, the protective layer 11, the chemical bonding layer 21, and the phosphor layer 12 are stacked in this order in the upward direction.

Figure 5B:
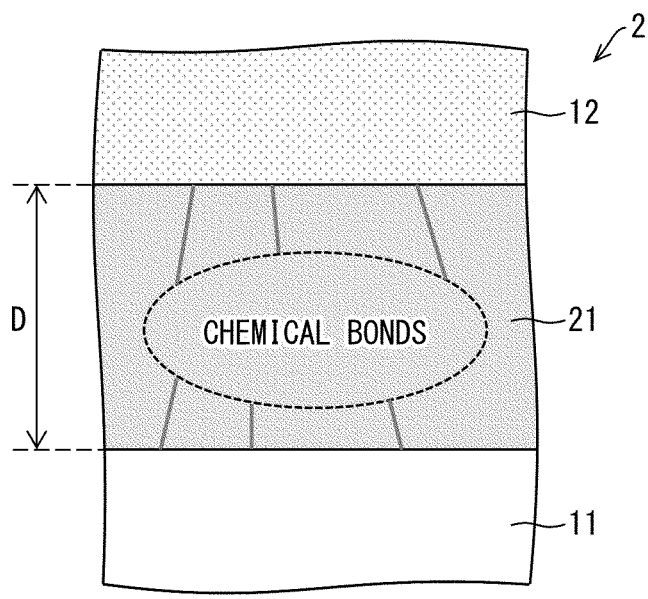
FIG. 5B is an enlarged view of a region P in FIG. 5A.

FIG. 5B is an enlarged view of a region P in FIG. 5A. As illustrated in FIG. 5B, the thickness of the chemical bonding layer 21 is also referred to as a thickness D.

Chemical Bonding Layer 21

The chemical bonding layer 21 is disposed to bond (fix, stick) together the protective layer 11 and the phosphor layer 12 by chemical bonds. The chemical bonding layer 21 plays the role of a sticking layer that sticks together the protective layer 11 and the phosphor layer 12 at their interface. FIG. 5B schematically illustrates the chemical bonding layer 21 bonding together the protective layer 11 and the phosphor layer 12 by chemical bonds.

The type of the chemical bonds is not particularly limited as long as they chemically bond together the protective layer 11 and the phosphor layer 12. However, as described later in Third embodiment, the chemical bonds may include "Si—O bonds".

The material for the chemical bonding layer 21 is also not particularly limited as long as it provides the chemical bonds. Second embodiment describes an example case of using a silane coupling agent as the material for the chemical bonding layer 21. The advantages of using a silane coupling agent as the material for the chemical bonding layer 21 will be described also in Third embodiment.

Incidentally, in FIG. 5A, for ease of explanation, the chemical bonding layer 21 is emphatically illustrated. Actually, the chemical bonding layer 21 has a thickness D sufficiently smaller than each of the thicknesses of the protective layer 11 and the phosphor layer 12.

Incidentally, in general, the protective layer 11 and the phosphor layer 12 have thicknesses at least on the order of submillimeters (about 1/10 of 1 mm).

The thickness D is not particularly limited as long as it is sufficiently smaller than each of the thicknesses of the protective layer 11 and the phosphor layer 12. The thickness D may be 1 µm or less. When the thickness D is 1 µm or less, sufficiently large contact areas with the protective layer 11 and the phosphor layer 12 are ensured, so that the chemical bonding layer 21 enables enhancement of bonding between the protective layer 11 and the phosphor layer 12.

In such a case where the thickness D is set to 1 µm or less, the mechanical strength of the light-emitting device 2 is further enhanced, which enables further enhancement of the durability of the light-emitting device 2.

The thickness D may be 100 nm or less. When the thickness D is 100 nm or less, in addition to the above-described enhancement of bonding, scattering or absorption of light (the excitation light L1 and the fluorescence L2) in the chemical bonding layer 21 is suppressed.

Thus, when the thickness D is set to 100 nm or less, the utilization ratios of the excitation light L1 and the fluorescence L2 in the light-emitting device 2 are enhanced, to thereby further enhance the light-emitting efficiency of the light-emitting device 2.

Example of Method for Producing Light-Emitting Device 2

An example of the method for producing the light-emitting device 2 includes the following Steps B1 to B5.

Steps B1 and B2

These steps are the same as Steps A1 and A2 above and the descriptions thereof will be omitted.

Step B3

Immediately after completion of the ultraviolet light irradiation, the upper surface of the protective layer 11 is coated with a dispersion liquid in which a silane coupling agent is dispersed (silane-coupling-agent dispersion liquid). The silane-coupling-agent dispersion liquid is prepared by diluting a silane coupling agent about 5- to about 10-fold with a diluent. The diluent may be water or selected from known organic solvents.

The silane-coupling-agent dispersion liquid may be applied such that the whole upper surface of the protective layer 11 is immersed in the dispersion. Alternatively, the silane-coupling-agent dispersion liquid may be applied to the upper surface of the protective layer 11 by spraying using a spraying device (such as a spray gun).

Step B4

The excess of the silane-coupling-agent dispersion liquid present on the upper surface of the protective layer 11 is removed. For example, the excess of the silane-coupling-agent dispersion liquid may be removed by heating at a temperature of 100° C. or less. Alternatively, the excess of the silane-coupling-agent dispersion liquid may be removed by vacuum drying, for example.

After the excess of the silane-coupling-agent dispersion liquid is removed, the silane-coupling-agent dispersion liquid left on the upper surface of the protective layer 11 is sufficiently dried. As a result, the above-described chemical bonding layer 21 is obtained.

Step B5

The upper surface of the chemical bonding layer 21 is coated with an ionic liquid resin the same as in Step A3 above. Subsequently, the same treatment as in Step A3 is performed to obtain the phosphor layer 12.

Advantages of Light-Emitting Device 2

As described above, compared with the light-emitting device 1 according to First embodiment, the light-emitting device 2 further includes the chemical bonding layer 21, which bonds together the protective layer 11 and the phosphor layer 12 by chemical bonds. This enables enhancement of the bonding between the protective layer 11 and the phosphor layer 12, compared with the light-emitting device 1.

Thus, the light-emitting device 2 enables further enhancement of the mechanical strength of the light-emitting device, compared with the light-emitting device 1. For example, when an external force is applied to the light-emitting device 2, separation between the protective layer 11 and the phosphor layer 12 is prevented. In summary, the light-emitting device 2 enables further enhancement of the durability of the light-emitting device.

Third Embodiment

Hereinafter, Third embodiment according to the present disclosure will be described with reference to FIGS. 6A and 6B. Hereafter, for ease of explanation, the light-emitting device according to Third embodiment will be referred to as a light-emitting device 3. In the light-emitting device 3, a chemical bonding layer will be referred to as a chemical bonding layer 31.

Figure 6A:
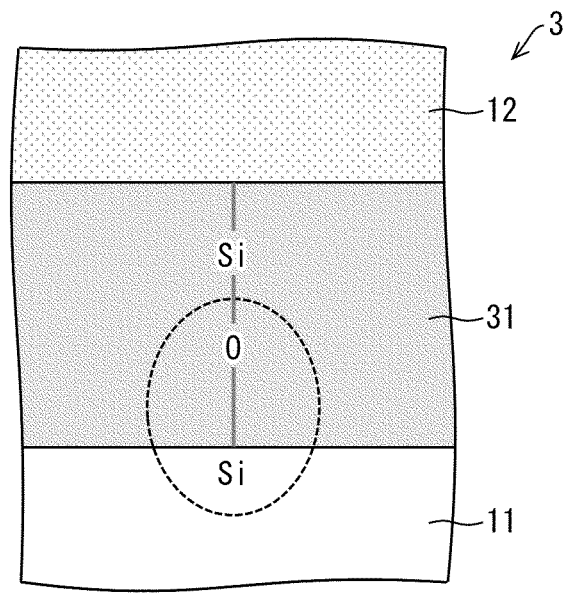
FIGS. 6A and 6B are enlarged views of a region P of a light-emitting device according to Third embodiment.
Figure 6B:
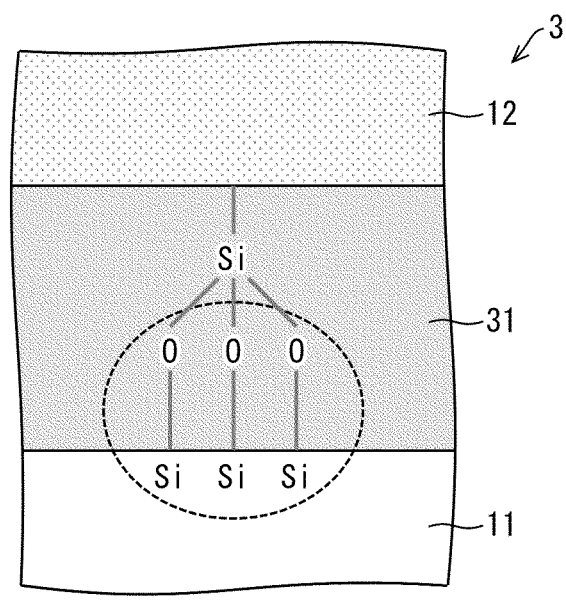

FIGS. 6A and 6B are enlarged views of the region P (refer to FIG. 5A described above) of the light-emitting device 3. As illustrated in FIGS. 6A and 6B, in the chemical bonding layer 31, chemical bonds that bond together the protective layer 11 and the phosphor layer 12 include Si—O bonds.

In general, such a Si—O bond is known as one of very strong chemical bonds among various chemical bonds. Thus, organic molecules having Si—O bonds are excellent in terms of chemical stability, heat resistance, and light resistance, for example. As a result, a layer containing such organic molecules has very high resistance to degradation.

Such organic molecules having Si—O bonds as their skeletons also have very high mechanical strength. Thus, a layer containing such organic molecules is less likely to be separated even under application of an external force, for example.

Thus, the chemical bonding layer 31, which bonds together the protective layer 11 and the phosphor layer 12 by chemical bonds including Si—O bonds, is formed to thereby further enhance the durability of the light-emitting device. In this way, the light-emitting device 3 enables enhancement of the durability, compared with the light-emitting device 2 according to Second embodiment.

The material for the chemical bonding layer 31 including Si—O bonds is, for example, a silane coupling agent. Hereinafter, the reason for using a silane coupling agent as the material for the chemical bonding layer 31 will be described. However, as described later, the material for the chemical bonding layer 31 is not limited to silane coupling agents. The material is appropriately selected from materials that enable formation of the chemical bonding layer 31 including Si—O bonds.

The silane coupling agent has a molecular structure represented by "X—Si—O—R" where X represents a functional group (first functional group, functional group X) such as a vinyl group, an epoxy group, or a methacryloyl group, and R represents a functional group (second functional group, functional group R) such as a methoxy group or an ethoxy group.

As described above, the silane coupling agent has two different functional groups. Thus, the silane coupling agent can be used as the material for a sticking layer that sticks together two different materials (that is, the chemical bonding layer 31).

For example, the functional group R has high reactivity to the protective layer 11 (such as a layer formed of a silicone resin), but has low reactivity to the phosphor layer 12 (ionic liquid resin layer). On the other hand, the functional group X has low reactivity to the protective layer 11, but has high reactivity to the phosphor layer 12.

Thus, at the time when the chemical bonding layer 31 is formed in Step B4 described above, the functional groups R are chemically bonded to the protective layer 11, whereas the functional groups X are not chemically bonded to the protective layer 11 and remain within the chemical bonding layer 31. Subsequently, in Step B5 described above, when the phosphor layer 12 is formed, the functional groups X present in the upper surface of the chemical bonding layer 31 are chemically bonded to the phosphor layer 12.

Thus, when the light-emitting device 3 is produced by, for example, Steps B1 to B5 described above, (i) the functional groups R are chemically bonded to the protective layer 11, and (ii) the functional groups X are chemically bonded to the phosphor layer 12. This provides, as illustrated in FIGS. 6A and 6B, the chemical bonding layer 31, which bonds together the protective layer 11 and the phosphor layer 12 by chemical bonds including Si—O bonds.

As described above, the chemical bonding layer 31 is formed, so that the chemical bonding layer 31, which includes a plurality of Si—O bonds, bonds together the protective layer 11 and the phosphor layer 12. FIG. 6B schematically illustrates a plurality of Si—O bonds included in the chemical bonding layer 31.

FIG. 6B illustrates an example in which a plurality of Si—O bonds are present at the interface between the chemical bonding layer 31 and the protective layer 11. In such a case, the Si—O bonds enable effective enhancement of the mechanical strength of the protective layer 11.

Modification

In Third embodiment described above, a silane coupling agent is described as an example of the material for the chemical bonding layer 31. However, the material for the chemical bonding layer 31 is not limited to silane coupling agents.

Other examples of the material for the chemical bonding layer 31 include silicon metal alkoxides such as TEOS (tetraethyl orthosilicate) and TMOS (tetramethyl orthosilicate). When such silicon metal alkoxides are used, the chemical bonding layer 31 including Si—O bonds are also obtained.

Fourth Embodiment

Hereinafter, Fourth embodiment according to the present disclosure will be described. Fourth embodiment describes two examples of the material for the protective layer 11 in a light-emitting device according to an embodiment of the present disclosure.

Silicone Resins

As described above, from the viewpoint of enhancing the light-emitting efficiency of the light-emitting device, the protective layer 11 may have high light transmittance. Thus, as the material for the protective layer 11, a resin material having high light transmittance may be employed. Examples of the resin material include silicone resins, epoxy resins, and acrylic resins.

As described above, from the viewpoint of enhancing the durability of the light-emitting device, the protective layer 11 may be formed so as to be excellent in terms of heat resistance, light resistance, and discoloration resistance. Among the above-described various resin materials, silicone resins are excellent in terms of heat resistance, light resistance, and discoloration resistance.

For this reason, of various materials for the protective layer 11, silicone resins may be used from the viewpoint of enhancing the light-emitting efficiency of the light-emitting device, and the viewpoint of enhancing the durability of the light-emitting device.

Epoxy Resins

Epoxy resins are excellent in terms of gas barrier properties and moisture barrier properties, compared with silicone resins. For this reason, for example, when the light-emitting device is used for a relatively long time in an environment at a high concentration of a predetermined gas (for example, within a chemical plant), or in an environment at a high humidity (for example, within a tunnel), the material for the protective layer 11 may be selected from epoxy resins.

When the material for the protective layer 11 is selected from epoxy resins, the durability of the light-emitting device can be sufficiently enhanced even in the case of using the light-emitting device in an environment at a high gas concentration or in an environment at a high humidity.

For example, the light-emitting element 110 sealed within the protective layer 11 is protected from the gas or moisture, to thereby prevent degradation (such as corrosion) of the light-emitting element 110. When a reflective member (reflector) configured to reflect light (the excitation light L1 and the fluorescence L2) is further sealed within the protective layer 11, degradation of the reflective member is also prevented.

As described above, epoxy resins have high light transmittance as with silicone resins. Thus, epoxy resins may be used as the material for the protective layer 11 from the viewpoint of enhancing the light-emitting efficiency of the light-emitting device.

Modification

Fourth embodiment above describes, as examples of the material for the protective layer 11, silicone resins and epoxy resins. However, the material for the protective layer 11 is not limited to these resins.

For example, as described above, the material for the protective layer 11 may be selected from acrylic resins. Alternatively, silsesquioxane UV (ultraviolet) curable resins may be used as the material for the protective layer 11.

The material for the protective layer 11 is not limited even to resin materials (organic materials). Other examples of the material for the protective layer 11 include inorganic materials such as $SiO_2$ (silicon oxide) and $Al_2O_3$ (aluminum oxide). As described above, the material for the protective layer 11 may be appropriately selected in accordance with the specifications of the light-emitting device from the viewpoint of light transmittance, heat resistance, light resistance, and discoloration resistance.

Fifth Embodiment

Hereinafter, Fifth embodiment according to the present disclosure will be described. Fifth embodiment describes specific examples of the material for the phosphor particles 120 (semiconductor nanoparticle phosphor) in a light-emitting device according to an embodiment of the present disclosure.

For example, the material for the phosphor particles 120 may be at least one material (semiconductor material) selected from the group consisting of InP, InN, InAs, InSb, InBi, ZnO, $In_2O_3$, $Ga_2O_3$, $ZrO_2$, $In_2S_3$, $Ga_2S_3$, $In_2Se_3$, $Ga_2Se_3$, $In_2Te_3$, $Ga_2Te_3$, CdSe, CdTe, and CdS.

More specifically, crystals having a size on the order of nanometers of the above-described semiconductor materials (semiconductor crystals) may be used as the material for the phosphor particles 120. The semiconductor crystals emit visible light in the wavelength range of about 380 nm to about 780 nm as the fluorescence L2. In other words, the semiconductor crystals have an energy band gap corresponding to the wavelength range (about 380 nm to about 780 nm) such that the crystals are excited by the excitation light L1 to emit the fluorescence L2 as visible light.

Incidentally, for ease of explanation, the above-described drawings including FIG. 1 illustrate example cases in which the phosphor particles 120 have a spherical shape. However, the shape of the phosphor particles 120 is not limited to spherical shapes. For example, the phosphor particles 120 may have a rod shape, or a wire shape. The shape of the phosphor particles 120 may be freely selected from known shapes.

Modification

For ease of explanation, the above-described embodiments describe example cases in which the phosphor layer 12 includes phosphor particles 120 of a single type alone. Alternatively, the phosphor layer 12 may include phosphor particles 120 of two or more types (a plurality of types).

For example, the phosphor layer 12 may include (i) first phosphor particles configured to emit green light as fluorescence, and (ii) second phosphor particles configured to emit red light as fluorescence. Such a configuration also provides white illumination light as a result of mixing of excitation light (such as blue light) and fluorescence (green light and red light).

The individual materials for phosphor particles 120 of plural types included in the phosphor layer 12 (in other words, the wavelengths of fluorescences emitted from phosphor particles 120 of different types) may be appropriately selected in accordance with the desired color of the illumination light.

Sixth Embodiment

Hereinafter, Sixth embodiment according to the present disclosure will be described with reference to FIG. 7. Sixth embodiment describes an image display apparatus 1000 including the light-emitting device 1 according to First embodiment. Incidentally, in the image display apparatus 1000, the light-emitting device 1 may be replaced by the light-emitting device according to any one of Second to Fifth Embodiments.

Figure 7:
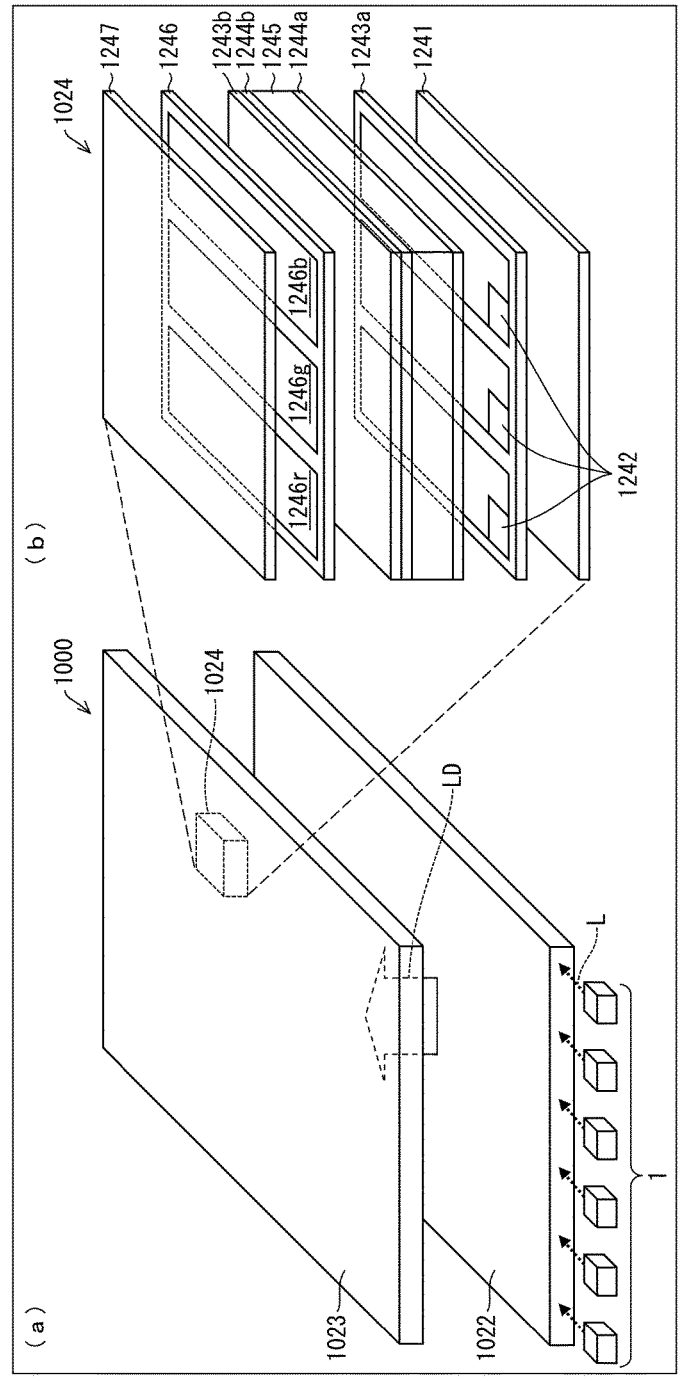
FIG. 7 includes a portion (a) that is an exploded perspective view of an image display apparatus according to Sixth embodiment, and a portion (b) that is an exploded perspective view of a liquid crystal display device included in the image display apparatus illustrated in the portion (a).

FIG. 7 includes a portion (a) that is an exploded perspective view of the image display apparatus 1000. FIG. 7 includes a portion (b) that is an exploded perspective view of a liquid crystal display device 1024 included in the image display apparatus 1000.

The image display apparatus 1000 includes the light-emitting device 1, a light guide plate 1022, and a liquid crystal display section 1023. The light guide plate 1022 is a transparent or translucent light guide plate. The liquid crystal display section 1023 is a display section configured to display images, and includes a plurality of liquid crystal display devices 1024.

In the image display apparatus 1000, on a side surface of the light guide plate 1022, a plurality of light-emitting devices 1 are disposed. In the image display apparatus 1000, the plurality of light-emitting devices 1 each function as a backlight.

In the image display apparatus 1000, the liquid crystal display section 1023 is disposed adjacent to the light guide plate 1022. Output light L (mixed light of the excitation light L1 and the fluorescence L2) from the light-emitting devices 1 is scattered within the light guide plate 1022, and the resultant scattered light LD is applied to the whole surface of the liquid crystal display section 1023.

As illustrated in the portion (b) of FIG. 7, the liquid crystal display device 1024 constituting the liquid crystal display section 1023 includes the following members stacked in this order: a polarizing plate 1241, a transparent conductive film 1243a (including thin-film transistors 1242), an alignment film 1244*a*, a liquid crystal layer 1245, an alignment film 1244*b*, an upper thin film electrode 1243*b*, a color filter 1246 configured to display color pixels, and an upper polarizing plate 1247.

The color filter 1246 is divided so as to have a size corresponding to each pixel of the transparent conductive film 1243*a*. The color filter 1246 includes a red color filter 1246*r* configured to transmit red light, a green color filter 1246*g* configured to transmit green light, and a blue color filter 1246*b* configured to transmit blue light.

As described above, the image display apparatus 1000 includes the light-emitting devices 1 (light-emitting devices having higher durability than existing ones). Thus, the image display apparatus 1000 enables an image display apparatus having higher durability than existing ones.

Modification

A light-emitting device according to an embodiment of the present disclosure may be applied to lighting apparatuses, for example. Such lighting apparatuses may be applied to, for example, high-ceiling lighting (for example, spotlights or downlights) or road lighting.

A lighting apparatus according to an embodiment of the present disclosure at least includes a light-emitting device according to an embodiment of the present disclosure. This configuration enables a lighting apparatus having higher durability than existing ones.

APPENDIX

A light-emitting device (1) according to Embodiment 1 of the present disclosure includes an excitation light source (light-emitting element 110) configured to emit excitation light (L1); a phosphor layer (12) in which a semiconductor nanoparticle phosphor (phosphor particles 120) is dispersed so as to emit fluorescence (L2) in response to the excitation light, the phosphor layer including a constitutional unit derived from an ionic liquid having a polymerizable functional group; and a protective layer (11) that seals the excitation light source therein.

As described above, the phosphor layer including a constitutional unit derived from an ionic liquid having a polymerizable functional group (that is, an ionic liquid resin layer) contains sulfur (S) as a constituent element.

The inventors have newly found the following problem: when the ionic liquid resin layer is in contact with electrodes (electrodes configured to drive the excitation light source) included in the excitation light source (light-emitting element) and the package, the electrodes may be sulfurized; and the sulfurization of the electrodes may result in degradation of the light-emitting device. As a specific configuration for addressing this problem, the inventors have newly found the above-described configuration of a light-emitting device (refer to FIGS. 1 to 4, for example).

In the above-described configuration, the excitation light source is sealed within the protective layer, so that the protective layer isolates the light-emitting element from the phosphor layer. In addition, the electrodes can also be disposed so as to be isolated from the phosphor layer. Thus, sulfurization of the electrodes is prevented, to thereby provide a light-emitting device having higher durability than existing ones.

A light-emitting device according to Embodiment 2 of the present disclosure is the light-emitting device according to Embodiment 1 above, further including an electrode (111) configured to drive the excitation light source, the electrode being isolated, by the protective layer, from the phosphor layer.

In the above-described configuration, the electrode is disposed so as to be isolated, by the protective layer, from the phosphor layer. This provides the same advantages as in the above-described light-emitting device according to an embodiment of the present disclosure.

A light-emitting device according to Embodiment 3 of the present disclosure is the light-emitting device according to Embodiment 1 or 2 above, further including a chemical bonding layer (21) that bonds together, by a chemical bond, the protective layer and the phosphor layer.

In the above-described configuration, the chemical bonding layer is used to bond together the protective layer and the phosphor layer, to thereby enhance the mechanical strength of the light-emitting device. This enables further enhancement of the durability of the light-emitting device.

A light-emitting device according to Embodiment 4 of the present disclosure is the light-emitting device according to Embodiment 3 above, wherein the chemical bond includes a Si—O bond.

As described above, the Si—O bond is one of very strong chemical bonds among various chemical bonds. Thus, the above-described configuration enables further enhancement of the durability of the light-emitting device.

A light-emitting device according to Embodiment 5 of the present disclosure is the light-emitting device according to Embodiment 3 or 4 above, wherein the chemical bonding layer has a thickness (D) of 1 μm or less.

The above-described configuration enables further enhancement of the bonding between the protective layer and the phosphor layer by using the chemical bonding layer. This enables further enhancement of the durability of the light-emitting device.

A light-emitting device according to Embodiment 6 of the present disclosure is the light-emitting device according to Embodiment 5 above, wherein the chemical bonding layer has a thickness of 100 nm or less.

The above-described configuration enables further suppression of scattering or absorption of light (excitation light and fluorescence) in the chemical bonding layer. This enables enhancement of the light-emitting efficiency of the light-emitting device.

A light-emitting device according to Embodiment 7 of the present disclosure is the light-emitting device according to any one of Embodiments 1 to 6 above, wherein the protective layer is formed of a silicone resin.

As described above, of materials for the protective layer, silicone resins are excellent in terms of heat resistance, light resistance, and discoloration resistance. In addition, silicone resins also have high light transmittance. Thus, the above-described configuration enables further enhancement of the durability and light-emitting efficiency of the light-emitting device.

A light-emitting device according to Embodiment 8 of the present disclosure is the light-emitting device according to any one of Embodiments 1 to 6, wherein the protective layer is formed of an epoxy resin.

As described above, epoxy resins are excellent in terms of gas barrier properties and moisture barrier properties, compared with silicone resins. Thus, the above-described configuration enables sufficient enhancement of the durability of the light-emitting device even when the light-emitting device is used in, for example, an environment at a high gas concentration or an environment at a high humidity.

An image display apparatus (1000) according to Embodiment 9 of the present disclosure includes the light-emitting device according to any one of Embodiments 1 to 8.

This configuration provides the same advantages as in the above-described light-emitting device according to an embodiment of the present disclosure.

The present disclosure contains subject matter related to that disclosed in Japanese Priority Patent Application JP 2017-030231 filed in the Japan Patent Office on Feb. 21, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light-emitting device comprising:
   an excitation light source configured to emit excitation light;
   a phosphor layer in which a semiconductor nanoparticle phosphor is dispersed so as to emit fluorescence in response to the excitation light, the phosphor layer including a constitutional unit derived from an ionic liquid having a polymerizable functional group; and
   a protective layer that seals the excitation light source therein, wherein
   the phosphor layer contains sulfur as a constituent element.

2. The light-emitting device according to claim 1, further comprising an electrode configured to drive the excitation light source,
   the electrode being isolated, by the protective layer, from the phosphor layer.

3. The light-emitting device according to claim 1, further comprising a chemical bonding layer that bonds together, by a chemical bond, the protective layer and the phosphor layer.

4. The light-emitting device according to claim 3, wherein the chemical bond includes a Si—O bond.

5. The light-emitting device according to claim 3, wherein the chemical bonding layer has a thickness of 1 μm or less.

6. The light-emitting device according to claim 3, wherein the chemical bonding layer has a thickness of 100 nm or less.

7. The light-emitting device according to claim 1, wherein the protective layer is formed of a silicone resin.

8. The light-emitting device according to claim 1, wherein the protective layer is formed of an epoxy resin.

9. An image display apparatus comprising the light-emitting device according to claim 1.

10. An image display apparatus comprising the light-emitting device according to claim 2.

11. An image display apparatus comprising the light-emitting device according to claim 3.

12. An image display apparatus comprising the light-emitting device according to claim 4.

13. An image display apparatus comprising the light-emitting device according to claim 5.

14. An image display apparatus comprising the light-emitting device according to claim 6.

15. An image display apparatus comprising the light-emitting device according to claim 7.

16. An image display apparatus comprising the light-emitting device according to claim 8.

17. The light-emitting device as set forth in claim 1, wherein the ionic liquid contains sulfur as a constituent element.

18. The light-emitting device as set forth in claim 1, wherein the ion liquid is represented by the following general formula (I):

$$X^+Y^- \qquad (I),$$

where $Y^-$ is any one of the following:
   a bistrifluoromethylsulfonylimidate ion,
   a tris(trifluoromethylsulfonyl)carbonate ion, and
   a trifluoromethanesulfonate ion.

* * * * *